(12) United States Patent
Wu et al.

(10) Patent No.: US 6,259,161 B1
(45) Date of Patent: Jul. 10, 2001

(54) CIRCUIT ELECTRODE CONNECTED TO A PATTERN FORMED ON AN ORGANIC SUBSTRATE AND METHOD OF FORMING THE SAME

(75) Inventors: Qiang Wu; Yoshihiro Tomita, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/444,825

(22) Filed: Nov. 22, 1999

(30) Foreign Application Priority Data

Jun. 18, 1999 (JP) .................................. 11-173418

(51) Int. Cl.⁷ .......................... H01L 23/48; H01L 23/52; H01L 29/40

(52) U.S. Cl. .......................... 257/766; 257/784; 257/781; 438/652

(58) Field of Search .................................. 257/766, 784, 257/780, 781; 438/573, 614, 652

(56) References Cited

U.S. PATENT DOCUMENTS

| | | | |
|---|---|---|---|
| 4,268,584 | * | 5/1981 | Ahn et al. . |
| 4,970,571 | * | 11/1990 | Yamakawa et al. . |
| 5,272,111 | * | 12/1993 | Kosaki . |
| 5,893,725 | * | 4/1999 | Bhansali . |
| 5,998,043 | * | 12/1999 | Sasaki et al. . |

FOREIGN PATENT DOCUMENTS

| | | |
|---|---|---|
| 6-264284 | 9/1994 | (JP) . |
| 7-7243 | 1/1995 | (JP) . |
| 10-256708 | 9/1998 | (JP) . |

* cited by examiner

*Primary Examiner*—Sheila V. Clark
(74) *Attorney, Agent, or Firm*—McDermott, Will & Emery

(57) ABSTRACT

There is described a circuit electrode formed in an integrated circuit package, which imparts sufficient bonding strength to a soldered section and prevents oxidation of the surface of an Ni—P film without fail. A circuit electrode to be electrically connected to a pattern formed on an organic substrate is formed. An electroless high-concentration Ni—P plating film containing phosphorous at a concentration of 7 to 12 wt. % is formed to a thickness of 3 to 10 $\mu$m so as to cover predetermined portions of the pattern. An electroless low-concentration Ni—P plating film containing phosphorous at a concentration of 3 wt. % or less is formed to a thickness of 0.5 to 10 $\mu$m so as to cover the electroless high-concentration Ni—P plating film. An electroless gold plating film is formed, as an oxidation prevention film, to a thickness of 0.05 to 0.5 $\mu$m so as to cover the surface of the electroless low-concentration Ni—P plating film.

14 Claims, 3 Drawing Sheets

PRIOR ART

CIRCUIT ELECTRODE CONNECTED TO A PATTERN FORMED ON AN ORGANIC SUBSTRATE AND METHOD OF FORMING THE SAME

BACKGROUND OF THE INVENTION

1. Field of the Invention

The present invention generally relates to a circuit electrode and a method of forming a circuit electrode. More particularly, the present invention relates to a circuit electrode formed on a package of an integrated circuit or on a printed circuit board of the same, as well as to a method of forming such a circuit electrode.

2. Description of the Background Art

A ball grid array (BGA) package and a chip scale package (CSP) have already been known as packages suitable for meeting a demand for an integrated circuit having an increased number of pins. A circuit electrode coated with a metal pattern, such as a Cu pattern, by means of electroless plating is used for such a package.

FIG. 6 is a cross-sectional view showing a conventional integrated circuit package which is equipped with a circuit electrode having the above-described structure. The conventional integrated circuit package has an organic substrate 10. A pattern 12 is formed on the organic substrate 10 from metal, such as Cu. The metal pattern 12 is coated with an electroless Ni—P plating film 14 (hereinafter referred to as a "Ni—P film 14"), and the Ni—P film 14 is further coated with an immersion gold plating film 16 (hereinafter referred to as an "Au film 16"). On the surface of the organic substrate 10 is formed a passivation film 18 in order to prevent oxidation of the metal pattern 12 or flow of solder from the circuit electrode.

The Ni—P film 14 is an electroless plating film containing Ni as a major constituent and P in an amount of about 6 to 8 wt. %. This Ni—P film 14 is provided primarily for the purpose of preventing diffusion of Cu, which constitutes the pattern 12. The Au film 16 is an electroless plating film formed on the Ni—P film 14 by means of the substitution plating technique and is provided primarily for the purpose of preventing oxidation of the Ni—P film 14. In the above-described configuration, a circuit electrode is formed from the pattern 12, the Ni—P film 14, and the Au film 16. The circuit electrode is connected to an electrode of a printed circuit board by way of a solder ball or bump to be formed on the Au film 16 or by a bonding wire to be bonded on the same.

An electroless plating film of Au can be formed by the substitution plating technique or the reduction plating technique. However, if the reduction plating technique is employed for forming the Au film on a Ni—P film 14, existence of Ni ions hinders growth of the Au film. For this reason, the Au film 16 must also be grown by means of the substitution plating technique, before employing reduction gold plating, as mentioned previously.

The substitution plating technique is a method of growing an Au film by substituting Au for Ni contained in the Ni—P film 14. Since P is not substituted by Au at this time, Au is first deposited on the P-free areas of the surface of the Ni—P film 14 during the course of plating of the Au film 16. Accordingly, during the course of plating of the Au film 16, the lower the P concentration in the Ni—P film 14, the faster the rate of substituting reaction between Ni and Au.

In other words, if the P concentration in the Ni—P film 14 is too high, substitution of Au for Ni is not sufficiently carried out, and pinholes are likely to arise in the Au film 16. In the event that pinholes arise in the Au film 16, oxidation of the Ni—P film 14 cannot be prevented, thus wire bonding or soldering without use of flux becomes difficult. For this reason, the P concentration in the Ni—P film 14 must not be set excessively high.

In the conventional circuit electrode, the P concentration in the Ni—P film 14 assumes a value of 6 to 8 wt. %. In other words, P ions occupy about 6 to 8% portion of the surface area of the Ni—P film 14. During the course of plating of the Au film 16, erosion of Ni by Au proceeds in the vertical direction while Ni is substituted by Au in the areas where P ions do not exist. If the rate of reaction between Au and Ni is high, erosion of Ni by Au becomes noticeable, resulting in formation of crack-shaped eroded portions in the Ni—P film 14.

The lower the P concentration of the Ni—P film 14, the faster Au ions react with Ni ions. For example, if the P concentration of the Ni—P film 14 assumes a value of 3.5 wt. %, Au is deposited to a thickness of 0.5 μm when the Au film 16 is plated for 10 minutes. In a case where the P concentration assumes a value of 7.5 wt. %, Au is deposited to a thickness of 0.3 μm when the Au film 16 is plated for 10 minutes. Further, in a case where the P concentration assumes a value of 9.5 wt. %, Au is deposited to a thickness of 0.05 μm when the Au film 16 is plated for 10 minutes. Thus, the lower the P concentration of the Ni—P film 16, the greater the amount of Ni ions that are substituted by Au ions during the plating process. As a result, crack-shaped eroded portions are likely to arise in the Ni—P film 14.

The areas of the Ni—P film 14 where Ni ions are substituted by Au ions are higher in P content than are other areas. At this time, the greater the amount of Ni ions substituted by Au ions, the higher the P concentration. Accordingly, the lower the original P content in the Ni—P film 14, the higher the differential in P content in the boundary region between the Au film 16 and the Ni—P film 14 after the Au film 16 has fully grown.

FIG. 7A shows a solder ball 20 bonded to the circuit electrode shown in FIG. 6. FIG. 7B shows removal of the solder ball 20 from the circuit electrode as a result of a shear test. In FIGS. 7A and 7B, like reference numerals are assigned to elements which are identical with or correspond to those shown in FIG. 6, and repetition of their explanations is omitted.

The solder ball 20 is formed from eutectic solder containing lead (Pb) and tin (Sn). During the course of the solder ball 20 being soldered to the circuit electrode, the Au film 16 covering the Ni—P film 14 becomes fused in the solder ball 20. As a result, the solder ball 20 comes into direct contact with the Ni—P film 14. After the solder ball 20 has come into contact with the Ni—P film 14, Sn contained in the solder ball 20 react with Ni contained in the Ni—P film 14 to form an Ni/Sn compound 24 ($Ni_3Sn_4$).

During the course of generation of the Ni/Sn compound 24, the diffusion rate of Ni is reduced by the presence of P ions in the P-containing areas on the surface of the Ni—P film 14. If any areas of the surface of the Ni—P film 14 have a high P content, therefore, the Ni/Sn compound 24 is likely to assume a columnar profile as shown in FIGS. 7A and 7B. Further, since P ions are left in the Ni—P film 14 during the course of generation of the Ni/Sn compound 24, a P-rich layer 22 whose P content is higher than that of the other areas is generated in the vicinity of the boundary region between the solder ball 20 and the Ni—P film 14.

As a result of the Ni/Sn compound 24 acting as an adhesive, the solder ball 20 is soldered to the Ni—P film 14.

The P-rich layer 22 generated between the Ni/Sn compound 24 and the Ni—P film 14 acts as a contaminated layer and weakens the adhesive action of the Ni/Sn compound 24. Formation of the P-rich layer 22 results in a decrease in bonding strength between the solder ball 22 and the Ni—P film 14, which in turn renders the P-rich layer 22 susceptible to removal, as shown in FIG. 7B.

As mentioned above, as erosion of the Ni—P film 14 associated with growth of the Au film 16 becomes more noticeable, the P concentration on the surface of the Ni—P film 14 increases. In other words, as the erosion of the Ni—P film 14 associated with growth of the Au film 16 becomes more noticeable, the P ions existing in the Ni—P film 14 tend to become more concentrated. As the P ions existing on the surface of the Ni—P film 14 become more concentrated at the time of bonding of the solder ball 20, the P-rich layer 22 becomes more likely to be formed. Consequently, as the Ni—P film 14 becomes more noticeably eroded in association with growth of the Au film 16, the bonding strength between the solder ball 20 and the Ni—P film 14 becomes more likely to drop.

The portion of the Ni—P film 14 that is considerably eroded by Au ions has a greatly reduced Ni content. For this reason, when the solder ball 20 is bonded to the circuit electrode, the Ni/Sn compound 24 is less likely to be formed in the eroded portion. Even in this respect, if the Ni—P 14 film is eroded noticeably by Au ions, the bonding strength between the solder ball 20 and the Ni—P film 14 is likely to decrease. Accordingly, in order to ensure the bonding strength exerted on the solder ball 20, erosion of the Ni—P film 14 caused by Au ions must be prevented.

As mentioned above, in order to prevent formation of pinholes in the Au film 16, the P concentration in the Ni—P film 14 cannot be set excessively high. In contrast, in order to prevent erosion of the Ni—P film 14 caused by Au, the P concentration cannot be set excessively low. In consideration of these two conflicting requirements, the Ni—P film 14 has conventionally had a P content of 6 to 8 wt. %.

However, the conventional Ni—P film 14 can sufficiently prevent neither erosion of the Ni—P film 14 caused by Au, nor generation of the P-rich layer 22 caused by soldering. For example, in a case where the Au film 16 is provided to a thickness of about 0.2 μm on the surface of the Ni—P film 14 containing P at a concentration of 7.5 wt. %, the P concentration assumes a value of 10.2 wt. % within a depth of about 1 μm from the surface of the Ni—P film 14. Further, if the solder ball 20 is bonded to the Au film 16, the P concentration in the areas immediately below the Ni/Sn compound 24 assumes a value of 17.5 wt. %.

Thus, in the conventional circuit electrode using the Ni—P film 14 having a P content of 6 to 8 wt. %, the area between the solder ball 20 and the circuit electrode is still susceptible to solder failure. For example, in a case where a circuit electrode having a diameter of 0.6 mm, and comprising the Ni—P film 14 containing P at 6 to 8 wt. % and the Au film 16 of 0.12 μm thickness is formed on Cu pattern 12, the result of shear test were sometimes that the defective ratio which fractured between the solder balls 20 and the Ni—P film 14 is more than 40%.

Reducing the thickness of the Au film 16 is a conceivable measure for preventing erosion of the Ni—P film 14 caused by Au, i.e., for preventing generation of the P-rich layer 22. However, the thinner the Au film 16, the more susceptible the Au film is to formation of pinholes. For this reason, if the thickness of the Au film 16 is reduced, the organic substrate 10 must be etched immediately before being subjected to wire bonding or fluxless soldering, so as to eliminate the oxide film from the surface of the circuit electrode. Accordingly, reducing the thickness of the Au film 16 to prevent generation of the P-rich layer 22 results in disadvantages such as deterioration of reliability of the circuit and an increase of manufacturing cost of the same.

SUMMARY OF THE INVENTION

The present invention has been conceived to solve the foregoing problems, and the object of the present invention is to provide a circuit electrode which can impart sufficient bonding strength to a soldered portion and prevent oxidation of the surface of an Ni—P film without fail, as well as a method of forming such a circuit electrode.

The above objects of the present invention are achieved by a circuit electrode to be electrically connected to a pattern formed on an organic substrate. The circuit electrode includes an electroless high-concentration Ni—P plating film which contains phosphorous at a concentration of 7 to 12 wt. % and has a thickness of 3 to 10 μm so as to cover predetermined portions of the pattern. On the electroless high-concentration Ni—P plating film is provided an electroless low-concentration Ni—P plating film which contains phosphorous at a concentration of 3 wt. % or less and has a thickness of 0.5 to 10 μm so as to cover the electroless high-concentration Ni—P plating film. The circuit electrode further including an oxidation prevention film which covers the surface of the electroless low-concentration Ni—P plating film.

The above objects of the present invention are also achieved by a method of forming a circuit electrode to be electrically connected to a pattern formed on an organic substrate. In the method, an electroless high-concentration Ni—P plating film which contains phosphorous at a concentration of 7 to 12 wt. % and has a thickness of 3 to 10 μm is formed so as to cover predetermined portions of the pattern. An electroless low-concentration Ni—P plating film which contains phosphorous at a concentration of 3 wt. % or less and has a thickness of 0.5 to 10 μm is also formed so as to cover the electroless high-concentration Ni—P plating film. Further, an oxidation prevention film which covers the surface of the electroless low-concentration Ni—P plating film is formed.

Other objects and further features of the present invention will be apparent from the following detailed description when read in conjunction with the accompanying drawings.

DESCRIPTION OF THE PREFERRED EMBODIMENTS

Figure 1:
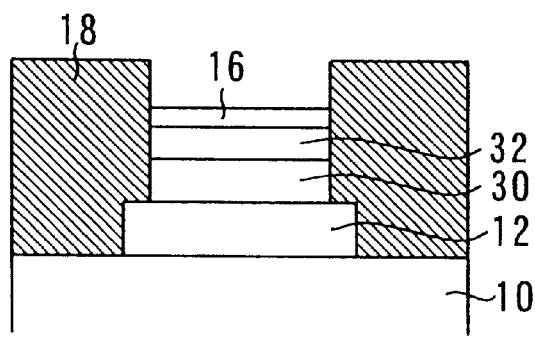
FIG. 1 is a cross-sectional view showing an integrated circuit package having a circuit electrode according to a first embodiment of the present invention.

In the following, principles and embodiments of the present invention will be described with reference to the accompanying drawings. Throughout the drawings, like reference numerals designate like or corresponding elements, and repetition of their explanations is omitted for brevity.

First Embodiment

FIG. 1 is a cross-sectional view showing an integrated circuit package having a circuit electrode according to a first embodiment of the present invention. The integrated circuit package according to the first embodiment comprises an organic substrate 10, and a pattern 12 formed from metal, such as Cu, on the surface of the organic substrate 10.

An electroless Ni—P plating film 30 having a high P content (hereinafter referred to as a "high-concentration Ni—P film 30") and an electroless Ni—P plating film 32 having a low P content (hereinafter referred to as a "low-concentration Ni—P film 32") are formed on the pattern 12, in this sequence. The high concentration Ni—P film 30 contains Ni as a major constituent and P at a concentration of about 11 wt. % and is formed to a thickness of 5 µm. The value of 11 wt. % is a target value for P content, and the essential requirement is that the P concentration assume a value of 7 to 12 wt. %. Further, the value of 5 µm is a target thickness for the high-concentration NiP plating film 30, and the essential requirement is that the high-concentration Ni—P film 30 assume a thickness of 3 to 10 µm.

The low-concentration Ni—P film 32 contains Ni as a major constituent and P at a concentration of about 2.5 wt. % and is formed to a thickness of about 0.6 µm. The value of 2.5 wt. % is a target value for P content, and the essential requirement is that the P concentration assume a value of 3 wt. % or less. Further, the value of 0.6 µm is a target thickness for the low-concentration Ni—P film 32, and the essential requirement is that the low-concentration Ni—P film 32 assume a thickness within the range of 0.5 to 1 µm.

Both the high-concentration Ni—P film 30 and the low-concentration Ni—P film 32 are formed by means of electroless plating. According to the electroless plating technique, the P concentration in a resultant Ni—P film can be controlled by adjusting the pH of a plating solution or the temperature at which plating is effected.

The Au film 16, which is an electroless plating film formed by substitution plating, is formed on the low-concentration Ni—P film 32 to a thickness of about 0.12 µm. The value of 0.12 µm is a target thickness for the Au film 16, and the essential requirement is that the Au film 16 assume a thickness of 0.05 to 0.5 µm.

The high-concentration Ni—P film 30 is formed primarily for the purpose of preventing diffusion of metal such as Cu constituting the pattern 12 and erosion of the Ni—P film caused in association with formation of the Au film 16. Further, the low-concentration Ni—P film 32 is provided for the purpose of facilitating formation of the Au film 16. Moreover, the Au film 16 is provided primarily for the purpose of preventing oxidation of the low-concentration Ni—P film 32.

In the first embodiment, a circuit electrode of the integrated circuit is constituted of the pattern 12, the high-concentration Ni—P film 30, the low-concentration Ni—P film 32, and the Au film 16. The circuit electrode is connected to an electrode of a printed circuit board by means of bonding a wire to the Au film 16, or by way of a solder ball or bump to be formed on the Au film 16.

A passivation film 18 is formed on the surface of the organic substrate 10 in order to prevent oxidation of the pattern 12 or flow of solder from the circuit electrode. The Ni—P films 30 and 32 can be plated onto the Cu pattern 21 at about 90° C. or less during the course of formation of the circuit electrode. Further, according to the circuit electrode having the foregoing structure, good adhesion can be ensured between the Ni—P film (the high-concentration Ni—P film 30) and the under layer metal (Cu) of the same, without involvement of heat treatment. Therefore, the circuit electrode of the structure according to the first embodiment can be sufficiently applied to the organic substrate 10 whose glass transition temperature is about 150° C.

In the first embodiment, the two plating layers (high-concentration Ni—P film 30 and the low-concentration Ni—P film 32) provided below the Au film 16 are of the same type (Ni—P film). Therefore, sufficient bonding strength can be ensured between these two plating layers. Accordingly, the circuit electrode according to the first embodiment can ensure reliability superior to that of a circuit electrode comprising a plurality types of plating layers.

As mentioned above, in the first embodiment, the Au film 16 is grown by means of the substitution plating technique. Substitution plating is a method of growing an Au film by substituting Au for Ni contained in the Ni—P film. The Au film is produced more readily by the substitution plating technique, as the P concentration in the Ni—P film which serves as an under layer film becomes lower. As the P concentration in the Ni—P film becomes lower, the Ni—P film serving as an under layer film is more intensively eroded in a longitudinal direction in association with growth of the Au film 16.

In the first embodiment, the lower-concentration Ni—P film 32 and the high-concentration Ni—P film 30 are formed as the under layer film. Since the low-concentration Ni—P film 32 has a low P content, the Au film 16 can be readily formed on the low-concentration Ni—P film 32. In contrast, since the high-concentration Ni—P film 30 has a high P content, the film 30 can effectively prevent diffusion of Cu in the pattern 12, thus effectively preventing erosion of the Ni—P film caused by Au during the course of growth of the Au film 16.

In the first embodiment, since the Au film 16 is grown on the surface of the low-concentration film Ni—P film 32, the Au film 16 can be readily formed without pinholes being formed. Further, since the high-concentration Ni—P film 30 is formed below the low-concentration Ni—P film 32, further deep erosion of the circuit electrode beyond the low-concentration Ni—P film 32 caused by Au can be effectively prevented. Thus, in the circuit electrode according to the first embodiment, the Au film 16 can be formed to be of high quality while the P concentration in the surface of the Ni—P film is appropriately controlled.

As mentioned above, according to the first embodiment, the P concentration of the high-concentration Ni—P film 30 is set to 7 to 12 wt. %. More specifically, the high-concentration Ni—P film 30 is grown while targeting P content of 11 wt. %, in consideration of variations in manufacturing conditions. If the P concentration assumes a value of 7 wt. % or less, obtaining sufficient resistance to erosion becomes difficult. In contrast, if the P concentration assumes a value of 12 wt. % or more, the Ni—P film becomes brittle, thus making it impossible to obtain sufficient mechanical strength. However, the P concentration employed in the first embodiment avoids these problems and imparts both of sufficient mechanical strength and sufficient resistance to erosion to the high-concentration Ni—P film 30.

As mentioned above, in the first embodiment, the thickness of the low-concentration Ni—P film 32 is controlled to a value of 0.5 to 1 $\mu$m. More specifically, the low-concentration Ni—P film 32 is grown while targeting a thickness of 0.6 $\mu$m, in consideration of variations in manufacturing conditions. If the thickness of the low-concentration Ni—P film 32 is less than 0.5 $\mu$m, growth of the high-quality Au film 16 becomes impossible. In contrast, if the thickness of the low-concentration Ni—P film 32 exceeds 1 $\mu$m, the low-concentration Ni—P film 32 is longitudinally eroded by Au ions to an excessive degree, so that cracks become likely to arise in the low-concentration Ni—P film 32. The thickness of the low-concentration Ni—P film 32 according to the first embodiment avoids occurrence of the foregoing problems, prevents cracks, and imparts high quality to the Au film 16.

Further, in the first embodiment, the P concentration in the low-concentration Ni—P film 32 is controlled so as to assume a value of 3 wt. % or less. In terms of easy growth of the high-quality Au film 16, a lower P content in the low-concentration Ni—P film 32 is more desirable. However, the lower the P concentration, the more difficult the formation of the low-concentration Ni—P film 32. In the present embodiment, in consideration that the variation in the P concentration of the Ni—P film is about 1 wt. %, the low-concentration Ni—P film 32 is grown while targeting P content of 2.5 wt. %. In this case, the P concentration is controlled so as to assume a value of 3 wt. % or less, thereby readily enabling formation of the low-concentration Ni—P film 32 of stable quality.

Figure 2:
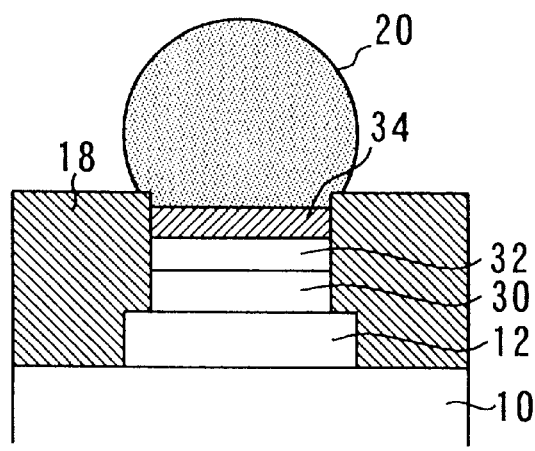
FIG. 2 is a cross-sectional view showing a state in which a solder ball 20 is bonded to the circuit electrode shown in FIG. 1.

FIG. 2 shows the circuit electrode shown in FIG. 1 when a solder ball 20 is bonded to the circuit electrode. In FIG. 2, like reference numerals are assigned to elements identical with or corresponding to those shown in FIG. 1, and repetition of their explanations is omitted here for brevity.

The solder ball 20 is formed from eutectic solder containing lead (Pb) and tin (Sn). During the course of the solder ball 20 being soldered to the circuit electrode, the Au film 16 covering the low-concentration Ni—P film 32 is fused in the solder ball 20. As a result, the solder ball 20 directly contacts the low-concentration Ni—P film 32. Since the surface of the low-concentration Ni—P film 32 has been protected by the high-quality Au film 16, no oxide layer is present on the surface of the low-concentration Ni—P film 32. Therefore, at the time of fusing of the solder ball 20, solder shows good wettability over the entire surface of the low-concentration Ni—P film 32.

When the solder ball 20 contacts the low-concentration Ni—P film 32, Sn contained in the solder ball 20 react with Ni contained in the low-concentration Ni—P film 32 to form an Ni/Sn compound 34 ($Ni_3Sn_4$). The Ni/Sn compound 34 is not formed in the areas on the surface of the Ni—P film where P ions are present. If any areas of the surface of the low-concentration Ni—P film 32 to be brought into contact with solder have a high P content, or if P ions are concentrated on the surface of the low-concentration Ni—P film 32 in association with formation of the Au film 16 although P content in the film 32 itself is low, generation of the Ni/Sn compound 34 is prevented.

Figure 7A:
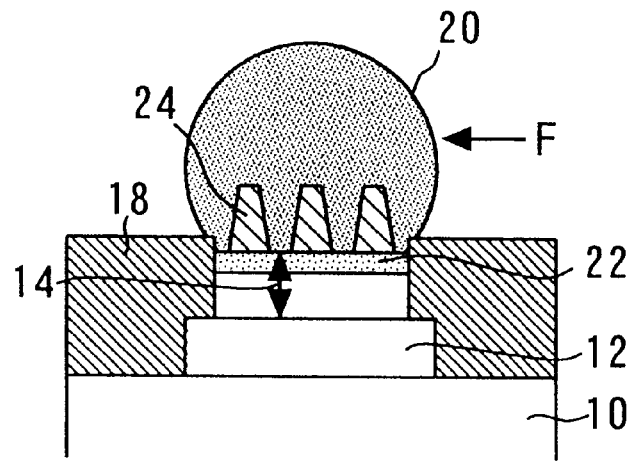
FIG. 7A is a cross-sectional view showing a state in which a solder ball 20 is bonded to the circuit electrode shown in FIG. 6.
Figure 7B:
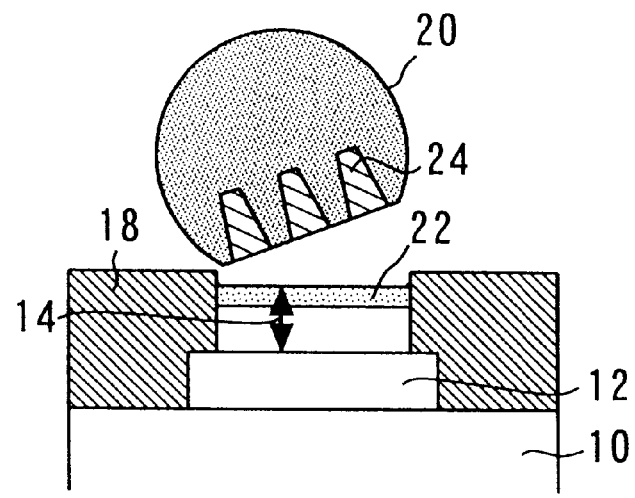
FIG. 7B is a cross-sectional view showing a state in which the solder ball 20 bonded to the circuit electrode shown in FIG. 6 is removed.

In the first embodiment, the P concentration of the low-concentration Ni—P film 32 to be brought in contact with the solder ball 20 is controlled so as to assume a small value. Further, erosion (crack-shaped erosion) contributing to concentration of P on the surface of the low-concentration Ni—P film 32 does not occur. For this reason, as shown in FIG. 2, the Ni/Sn compound 34 is formed, in the vicinity of the boundary region between the low-concentration Ni—P film 32 and the solder ball 20, in the form of a layer that extends over the entire surface of the low-concentration Ni—P film 32. In this case, comparing with the columnar-shaped Sn compound 24 (shown in FIG. 7), the Ni/Sn compound 34 in the present embodiment assuming the shape of a layer ensures a large contact area between solder and the circuit electrode.

Since P ions contained in the low-concentration Ni—P film 32 remain on the surface of the same during the course of generation of the Ni/Sn compound 34, a P-rich layer whose P content is higher than that of the other areas is generated in the vicinity of the boundary region between the solder ball 20 and the low-concentration Ni—P film 32. In the first embodiment, since the low-concentration Ni—P film 32 has a low P content, the P concentration of the P-rich layer can also be controlled so as to assume a small value.

As mentioned above, the structure of the circuit electrode according to the first embodiment ensures a large contact area between the solder ball 20 and the circuit electrode as well as reduces to a small value the P concentration of the P-rich layer generated in the vicinity of the boundary region between the solder ball 20 and the circuit electrode. Further, the larger the contact area and the lower the P concentration of the P-rich layer, the greater the bonding strength that develops between the solder ball 20 and the circuit electrode. For this reason, the structure of the circuit electrode according to the first embodiment ensures great bonding strength between the solder ball 20 and the circuit electrode. It is be noted that, in a shearing test in which a solder ball 20 having a diameter of 0.75 mm is bonded on the circuit electrode according to the first embodiment, the defective ratio which fractured between the solder balls 20 and the Ni—P film 14 was 0%.

Figure 3:
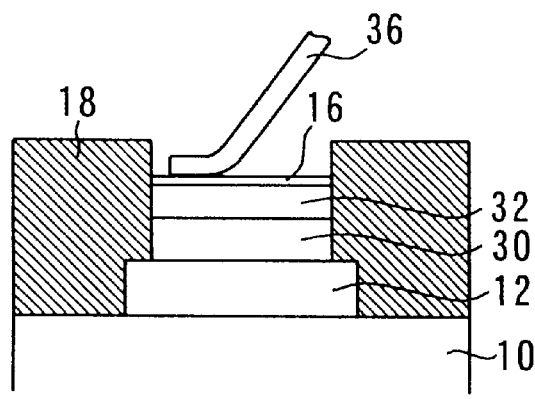
FIG. 3 is a cross-sectional view showing a state in which an Au line is wire-bonded to the circuit electrode shown in FIG. 1.

FIG. 3 shows the circuit electrode shown in FIG. 1 in the case where an Au line 36 was bonded to the circuit electrode. The quality of the Au film 16 has great influence on the reliability of the wire-bonding as well as on the bonding characteristics between the Au line 36 and the circuit electrode. As mentioned previously, the circuit electrode according to the first embodiment prevents generation of pinholes in the Au film 16 and imparts high quality to the Au film 16. Thus, according to the first embodiment, even when wire bonding is used for connecting the circuit electrode to another electrode, improved productivity and reliability can be ensured.

Second Embodiment

Figure 4:
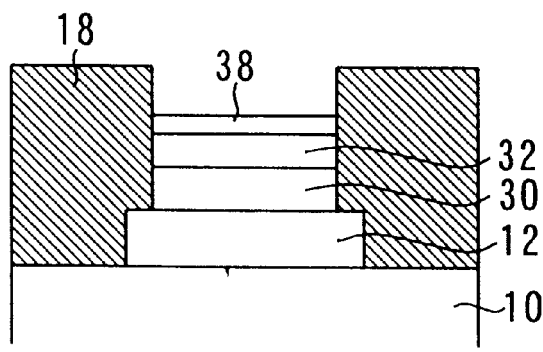
FIG. 4 is a cross-sectional view showing an integrated circuit package having a circuit electrode according to a second embodiment of the present invention.

A second embodiment of the present invention will now be described by reference to FIG. 4. FIG. 4 is a cross-sectional view showing an integrated circuit package including a circuit electrode according to the second embodiment. In FIG. 4, like reference numerals are assigned to elements which are identical with or correspond to those shown in FIG. 1, and repetition of their explanations is omitted.

In the circuit electrode according to the second embodiment, in place of the Au film 16 used in the first embodiment, a solder plating layer 38 is provided on the low-concentration Ni—P film 32. The solder plating layer 38 is an electroless plating film having a thickness of about 2 $\mu$m. The circuit electrode according to the second embodiment is connected to another electrode on a printed circuit board by way of the solder ball or bump formed on the solder plating layer 38.

In the second embodiment, the low-concentration Ni—P film 32 performs the same function as in the first embodiment. Consequently, an Ni/Sn compound is formed in a layer between the solder ball or bump and the circuit electrode. Further, a low-concentration P-rich layer is formed below the Ni/Sn compound. Accordingly, as in the case of the first embodiment, the circuit electrode according to the second embodiment can also ensure high bonding strength between solder and the solder plating layer 38.

Third Embodiment

Figure 5:
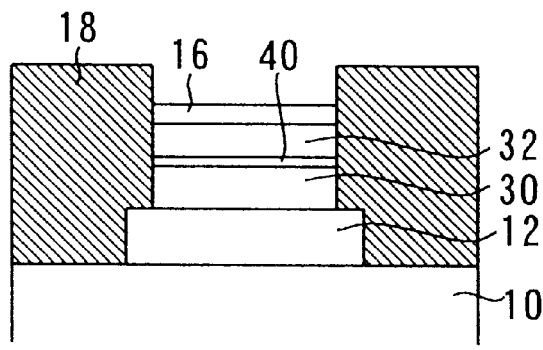
FIG. 5 is a cross-sectional view showing an integrated circuit package having a circuit electrode according to a third embodiment of the present invention.
Figure 6:
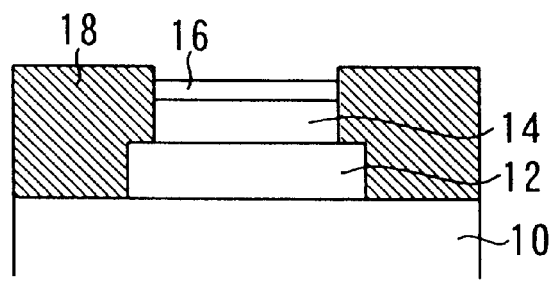
FIG. 6 is a cross-sectional view showing an integrated circuit package having a conventional circuit electrode.

A third embodiment will now be described by reference to FIG. 5. FIG. 5 is a cross-sectional view showing an integrated circuit having a circuit electrode according to the third embodiment. In FIG. 5, like reference numerals are assigned to elements which are identical with or correspond to those shown in FIG. 1, and repetition of their explanations is omitted.

The circuit electrode according to the third embodiment comprises an electroless Ni—P plating film 40 having an intermediate P content (hereinafter referred to as an "intermediate-concentration Ni—P film 40") formed between the high-concentration Ni—P film 30 and the low-concentration Ni—P film 32. The intermediate-concentration Ni—P film 40 is an electroless plating film having a thickness of about 0.1 $\mu$m and a P content of 6 to 8 wt. %. The circuit electrode according to the third embodiment mitigates variations in the P concentration in the Ni—P film interposed between the pattern 12 and the Au film 16, as compared with the case of the Ni—P film in the first embodiment. Accordingly, the circuit electrode in the third embodiment ensures a greater bonding strength compared with that in the first embodiment.

Although in the first through third embodiments the circuit electrode is limited to the electrode of the integrated circuit package, the present invention is not limited to such an electrode. More specifically, the structure of the circuit electrode according to the present invention can be widely applied to an electrode formed on an organic substrate, such as an electrode to be formed on a printed circuit board.

The major benefits of the present invention described above are summarized as follows:

According to the first aspect of the present invention, below an oxidation prevention film there are formed an electroless high-concentration Ni—P plating film containing P at a predetermined high concentration and an electroless low-concentration Ni—P plating film containing P at a predetermined low concentration. When solder is bonded on those films, an Ni/Sn compound is formed in the form of a layer between the solder and the low-concentration Ni—P plating film, as well that a P-rich layer whose P content is sufficiently reduced is formed below the Ni/Sn compound layer. Accordingly, the present invention realizes a circuit electrode that ensures sufficiently great bonding strength between solder and the Ni—P plating film.

According to the second aspect of the present invention, the oxidation prevention film can be formed from an electroless gold plating film. Below the electroless gold plating film, the electroless low-concentration Ni—P plating film and the electroless high-concentration Ni—P plating film are formed. According to the present invention, a high-quality Au electroless plating film having no pinholes is obtained while erosion of the Ni—P plating film caused by gold is suppressed.

According to the third aspect of the present invention, the circuit electrode can be electrically connected to another electrode by bonding a gold wire to the surface of the electroless gold plating film.

According to the fourth aspect of the present invention, the electroless solder plating film can constitute the oxidation prevention film. Compared with a case where the oxidation prevention film is formed from an electroless Au plating film, the present invention enables inexpensive formation of a circuit electrode.

According to the fifth aspect of the present invention, the circuit electrode can be electrically connected to another electrode by way of a solder ball or bump or a solder line formed on the electroless solder plating film.

According to the sixth aspect of the present invention, an electroless intermediate Ni—P plating film is interposed between the electroless high-concentration Ni—P plating film and the electroless low-concentration Ni—P plating film, thereby mitigating changes in the P concentration in the Ni—P film. Accordingly, the present invention imparts high bonding strength to the Ni—P film between a pattern and the oxidation prevention film.

According to the seventh aspect of the present invention, there can be provided an integrated circuit package including any one of the plurality of types of circuit electrodes according to the present invention.

According to the eighth aspect of the present invention, there can be provided a printed circuit board including any one of the plurality of types of circuit electrodes according to the present invention.

Further, the present invention is not limited to these embodiments, but variations and modifications may be made without departing from the scope of the present invention.

The entire disclosure of Japanese Patent Application No. Hei 11-173418 filed on Jun. 18, 1999 including specification, claims, drawings and summary are incorporated herein by reference in its entirety.

What is claimed is:

1. A circuit electrode to be electrically connected to a pattern formed on an organic substrate, the electrode comprising:

an electroless high-concentration Ni—P plating film which contains phosphorous at a concentration of 7 to 12 wt. % and has a thickness of 3 to 10 $\mu$m so as to cover predetermined portions of the pattern;

an electroless low-concentration Ni—P plating film which contains phosphorous at a concentration of 3 wt. % or less and has a thickness of 0.5 to 10 $\mu$m so as to cover the electroless high-concentration Ni—P plating film; and an oxidation prevention film which covers the surface of the electroless low-concentration Ni—P plating film.

2. The circuit electrode according to claim 1, wherein the oxidation prevention film is an electroless gold plating film having a thickness of 0.05 to 0.5 $\mu$m.

3. The circuit electrode according to claim 2, wherein a gold wire is wire-bonded to the surface of the electroless gold plating film.

4. The circuit electrode according to claim 1, wherein the oxidation prevention film is an electroless solder plating film.

5. The circuit electrode according to claim 4, wherein a solder ball or bump is fixed to, or a solder wire is wire-bonded to, the surface of the electroless solder plating film.

6. The circuit electrode according to claim 1, wherein an electroless intermediate-concentration Ni—P plating film containing phosphorous at a concentration of 6 to 8 wt. % is formed between the electroless high-concentration Ni—P plating film and the electroless low-concentration Ni—P plating film.

7. The circuit electrode according to claim 1, wherein the circuit electrode is provided in an integrated circuit package.

8. The circuit electrode according to claim 1, wherein the circuit electrode is provided on a printed circuit board.

9. A method of forming a circuit electrode to be electrically connected to a pattern formed on an organic substrate, the method comprising the steps of:
- forming an electroless high-concentration Ni—P plating film which contains phosphorous at a concentration of 7 to 12 wt. % and has a thickness of 3 to 10 μm so as to cover predetermined portions of the pattern;
- forming an electroless low-concentration Ni—P plating film which contains phosphorous at a concentration of 3 wt. % or less and has a thickness of 0.5 to 10 μm so as to cover the electroless high-concentration Ni—P plating film; and
- forming an oxidation prevention film which covers the surface of the electroless low-concentration Ni—P plating film.

10. The method of forming a circuit electrode according to claim 9, wherein the step of forming the oxidation prevention film includes a step of forming an electroless gold plating film to a thickness of 0.05 to 0.5 μm on the electroless low-concentration Ni—P plating film.

11. The method of forming a circuit electrode according to claim 10, further comprising a step of wire-bonding a gold wire to the surface of the electroless gold plating film.

12. The method of forming a circuit electrode according to claim 9, wherein the step of forming the oxidation prevention film includes a step of forming an electroless solder plating film on the electroless low-concentration Ni—P plating film.

13. The method of forming a circuit electrode according to claim 12, further comprising a step of fixing a solder ball or bump to or wiring-bonding a solder wire to the surface of the electroless solder plating film.

14. The method of forming a circuit electrode according to claim 9, further comprising a step of forming an electroless intermediate-concentration Ni—P plating film containing phosphorous at a concentration of 6 to 8 wt. % between the electroless high-concentration Ni—P plating film and the electroless low-concentration Ni—P plating film.

* * * * *